United States Patent [19]
Wen et al.

[11] Patent Number: 5,483,163
[45] Date of Patent: Jan. 9, 1996

[54] MRI COIL USING INDUCTIVELY COUPLED INDIVIDUALLY TUNED ELEMENTS ARRANGED AS FREE-PIVOTING COMPONENTS

[75] Inventors: Han Wen, Kensington, Md.; Andrew S. Chesnick, Fairfield, Pa.; Robert S. Balaban, Bethesda, Md.

[73] Assignee: The United States of America as represented by the Department of Health and Human Services, Washington, D.C.

[21] Appl. No.: 104,849

[22] Filed: Aug. 12, 1993

[51] Int. Cl.⁶ ............................................. G01R 33/28
[52] U.S. Cl. ............................................. 324/318; 324/322
[58] Field of Search ............................... 324/318, 322; 128/653.2; 335/296, 299, 298

[56] References Cited

U.S. PATENT DOCUMENTS

| | | | |
|---|---|---|---|
| 4,638,253 | 1/1987 | Jaskolski et al. | 324/318 |
| 4,639,673 | 1/1987 | Zijlstra | 324/318 |
| 4,680,548 | 7/1987 | Edelstein et al. | 324/318 |
| 4,692,705 | 9/1987 | Hayes | 324/318 |
| 4,694,255 | 9/1987 | Hayes | 324/318 |
| 4,698,595 | 10/1987 | Roschmann | 324/313 |
| 4,712,068 | 12/1987 | Savelainen | 324/318 |
| 4,716,370 | 12/1987 | Inoue et al. | 324/318 |
| 4,736,161 | 4/1988 | Prevot et al. | 324/318 |
| 4,737,718 | 4/1988 | Kemner et al. | 324/322 |
| 4,740,752 | 4/1988 | Arakawa et al. | 324/318 |
| 4,742,304 | 5/1988 | Schnall et al. | 324/318 |
| 4,751,464 | 6/1988 | Bridges | 324/318 |
| 4,763,074 | 8/1988 | Fox | 324/318 |
| 4,767,993 | 8/1988 | Hanawa | 324/318 |
| 4,788,503 | 11/1988 | Van Heelsbergen | 324/318 |
| 4,833,409 | 5/1989 | Eash | 324/318 |
| 4,845,431 | 7/1989 | Sullenberger | 324/318 |
| 4,887,039 | 12/1989 | Roemer et al. | 324/318 |
| 4,916,418 | 4/1990 | Rath | 324/318 |
| 4,928,064 | 5/1990 | Keren | 324/318 |
| 4,939,465 | 7/1990 | Biehl et al. | 324/318 |
| 4,987,370 | 1/1991 | Leussler et al. | 324/318 |
| 4,998,066 | 3/1991 | Wichern et al. | 324/322 |
| 5,003,265 | 3/1991 | Leussler | 324/318 |
| 5,017,872 | 5/1991 | Foo et al. | 324/318 |
| 5,041,788 | 8/1991 | Kontor et al. | 324/318 |
| 5,041,790 | 8/1991 | Tropp et al. | 324/318 |
| 5,053,711 | 10/1991 | Hayes et al. | 324/318 |
| 5,075,624 | 12/1991 | Bezjak | 324/318 |
| 5,132,621 | 7/1992 | Kang et al. | 324/318 |
| 5,143,688 | 9/1992 | Mansfield | 324/318 |
| 5,168,230 | 12/1992 | Hashoian et al. | 324/318 |
| 5,194,811 | 3/1993 | Murphy-Boesch et al. | 324/318 |
| 5,196,797 | 3/1993 | Tropp | 324/318 |
| 5,212,450 | 5/1993 | Murphy-Boesch et al. | 324/318 |
| 5,245,285 | 9/1993 | Ishizuka | 324/318 |
| 5,281,918 | 1/1994 | Lehr | 324/318 |

FOREIGN PATENT DOCUMENTS

| | | | |
|---|---|---|---|
| 9401785 | 1/1994 | WIPO | 324/318 |

OTHER PUBLICATIONS

Cecil E. Hayes, et al. "An Efficient, Highly Homogeneous Radiofrequency Coil for Whole–Body NMR Imaging at 1.5 T", Journal of Magnetic Resonance 63 (1985), pp. 622–628.
J. T. Vaughan, et al. "A High Frequency Tuned Resonator for Clinical NMR", 1992 Abstract for Sciencific Presentations to the Society of Magnetic Resonants in Medicine at the Annual Scientific Meeting (Aug. 14, 1992).

*Primary Examiner*—Sandra L. O'Shea
*Assistant Examiner*—Raymond Y. Mah
*Attorney, Agent, or Firm*—Lowe, Price, Leblanc & Becker

[57] ABSTRACT

An MRI probe/transmitter coil has a pair of concentric cylinders with a plurality of inductively coupled freely rotating resonant elements radially mounted between the two cylinders. The coil can be tuned both symmetrically by pivoting all the resonant elements uniformly or asymmetrically by tuning them individually. The coil is driven in quadrature by a quad-hybrid circuit. A substantial part of the electromagnetic energy is stored in the resonant elements outside of the loading region of the coil to reduce perturbation in the coil operation due to the characteristics of the test subject.

10 Claims, 6 Drawing Sheets

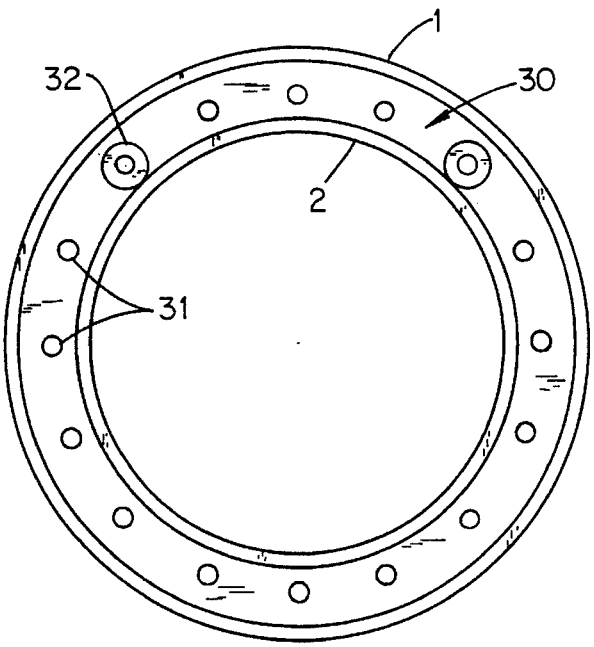
Figure 3
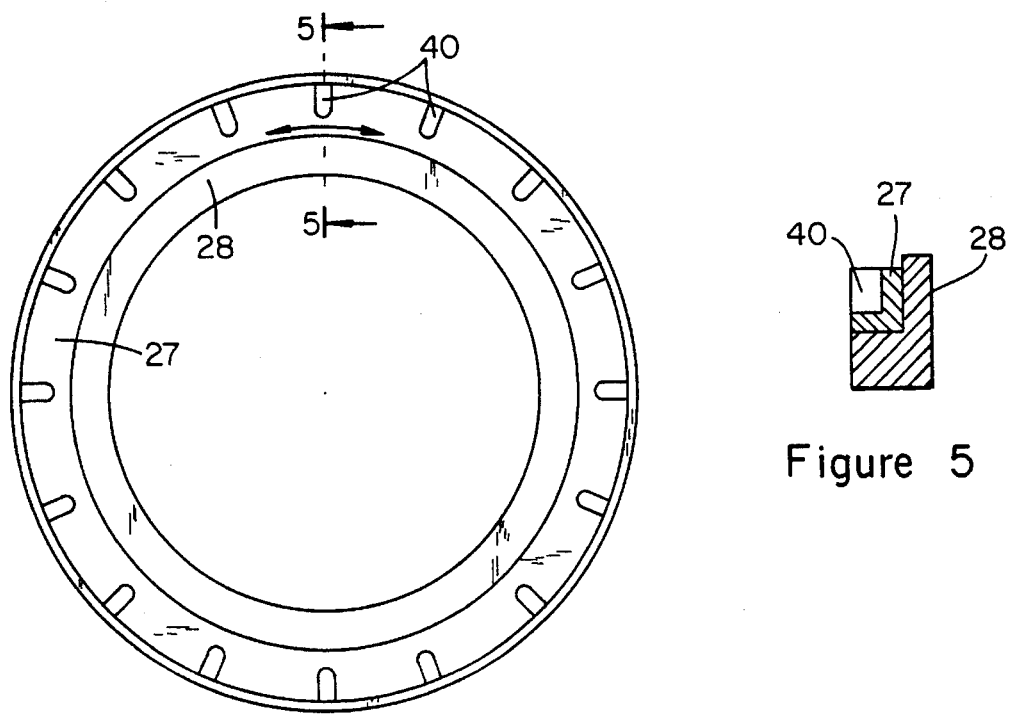
Figure 4
Figure 5

MRI COIL USING INDUCTIVELY COUPLED INDIVIDUALLY TUNED ELEMENTS ARRANGED AS FREE-PIVOTING COMPONENTS

TECHNICAL FIELD

The present invention relates generally to probe/transmitter coils for magnetic resonance imaging systems, and more particularly to a nuclear magnetic resonance transmittal/probe coil arranged to have high sensibility over large volumes and compensate for resonance frequency and field pattern variations caused by the characteristics of the subject under test.

BACKGROUND OF THE INVENTION

Magnetic Resonance Imaging (MRI) at high field values is fundamentally advantageous in its high sensitivity and its greater spectroscopic resolution than obtainable for lower field strength. High field MRI also has the capability of functional studies, such as functional brain mapping and various relaxation and diffusion studies. The probe/transmitter, which encases the segment of anatomy under study and constitutes the front end of the MRI system is essential for the realization of these advantages.

A well known problem in MRI systems having probes with large volumes is the prominent and complicated probe-subject interaction which changes the field distribution and resonance frequency of the probe. General compensating adjustments are usually ineffective since the changes in resonance frequency vary significantly among subjects, and is based on factors too numerous to easily factor into general system adjustments. Another problem is the substantial radiation losses of high field coils operating at high frequencies.

For example, MRI imaging at 4 Tesla requires that volume coils maintain efficiency and minimize susceptibility to perturbations introduced by the human body under test. This is so because the wavelength of proton resonance at 4 Tesla in water is approximately 20 cm, which is on the same order as the subject under test. This rough equality in size results in increased perturbation of the RF field pattern from the subject, and the perturbations become far more sensitive to the specific geometry and other characteristics of the subject. The increased perturbations also cause more significant loading frequency shifts. Consequently, it is necessary to be able to tune the coil easily for each subject without upsetting the symmetry of the coil which is necessary for maintaining the uniform of field pattern as well as quadrature drive and reception. Quadrature drive considered highly desirable since the RF power requirement is reduce by a factor of 2 and the signal to noise ratio is increased by a factor of √2.

One solution to this problem is a "bird cage" coil having a design based on a lumped-element delay line. This system is proposed in the Journal of Magnetic Resonance 63, pages 622–628 (1985) by an article entitled "An Efficient, Highly Homogeneous Radio Frequency Coil for Whole-Body NMR Imaging at 1.5T", authored by Cecil E. Hayes, William Edelstein, John F. Schenck, Otward Mueller and Matthew Eash. In this article, the use of the "bird cage" coil is studied with respect to using quadrature excitation and reception. The advantage of the arrangement described in this publication is that the current distribution in the coil give a more uniform signal sensitivity. The system of this article appears to be limited to a range of operation of approximately 1.5 Tesla proton or 65 MHz.

Another approach is to provide a tuning mechanism in the coil so that the overall coil resonance frequency can be tuned based upon the characteristics of each subject being tested. Such a system is disclosed in the 1992 Abstract for Scientific Presentations to the Society of Magnetic Resonants in Medicine at the Annual Scientific Meeting conducted in Berlin, Germany on Aug. 14, 1992. This article is entitled "A High Frequency Tuned Resonator for Clinical NMR" and is authored by J. T. Vaughan, J. O. Otu, H. P. Hetherington, P. Noa, and G. M. Pohost. This publication describes a head coil designed for operation at 175 MHz and 4.1 Tesla. The coil is designed to have a transverse virtual ground plane established by coaxial line segments and is configured in the "bird cage" arrangement disclosed in the previously discussed publication. The coaxial line segments are spaced around the periphery of the "bird cage" structure and run between the top and bottom plates. All of the coaxial conductors can be simultaneously tuned to maintain the symmetry necessary for quadrature excitation. With this arrangement, the head coil can be tuned over a limited range of approximately 20 MHz (175 MHz plus/minus 10 MHz) by means of a single screw. Field symmetry and magnitude are not significantly effected by this tuning. However, the unloaded and loaded Q values for the connected resonator average 420 vs. 65.

The conventional art previously described still suffers from the drawback of a low Q factor under high load conditions.

DISCLOSURE OF THE INVENTION

One object of the present invention is to reduce the effect of subject characteristics variations on the coil resonant frequency in a magnetic resonance imaging system.

Another object is to increase the sensitivity and efficiency in the magnetic resonance imaging system by raising the Q of the transmitter/probe coil.

A further object is to provide easy efficient tuning in a symmetrical manner of a transmitter/probe coil in a magnetic resonance imaging system.

Still a further object of the present invention is to provide both asymmetric adjustment and symmetric adjustment for specific subject anatomies in a high frequency, 4 Tesla magnetic resonance imaging system.

Still another object of the present invention is to provide an arrangement in which the resonant frequency of an MRI probe/transmitter coil can be easily adjusted in the field to accommodate different subject characteristics.

Yet another object of the present invention is to enable simultaneous adjustment of all the resonant elements in an MRI probe/transmitter coil.

The aforementioned objects are accomplished by an MRI probe/transmitter coil having a pair of concentric cylinders around which a plurality of resonant elements are arranged. These resonant elements are radially mounted between the cylinders. Preferably, the resonant elements are arranged in a symmetrical manner about the circumference of the concentric cylinders. The resonant elements are freely mounted on pivots and separate from each other. They can be rotated around their axes either individually, or, with the proper mechanism, all at one time. Thus, both symmetrical and asymmetrical tuning of the probe/transmitter coil can be effected.

The aforementioned objects are also facilitated by a transmitter/probe coil having a symmetrical arrangement including inductively coupled resonant elements used to store a significant portion of the magnetic field energy of the coil outside of the loading region of the coil during imaging or test conditions.

BRIEF DESCRIPTION OF THE DRAWINGS

FIG. 3 is a top view of the probe/transmitter coil illustrating the axles supporting the resonant elements.

FIG. 4 is a top view of the probe/transmitter coil illustrating an additional ring structure overlying the space between the concentric cylinders.

FIG. 5 is a cross-sectional view of the ring structure of FIG. 4.

BEST MODE FOR CARRYING OUT THE INVENTION

Figure 1:
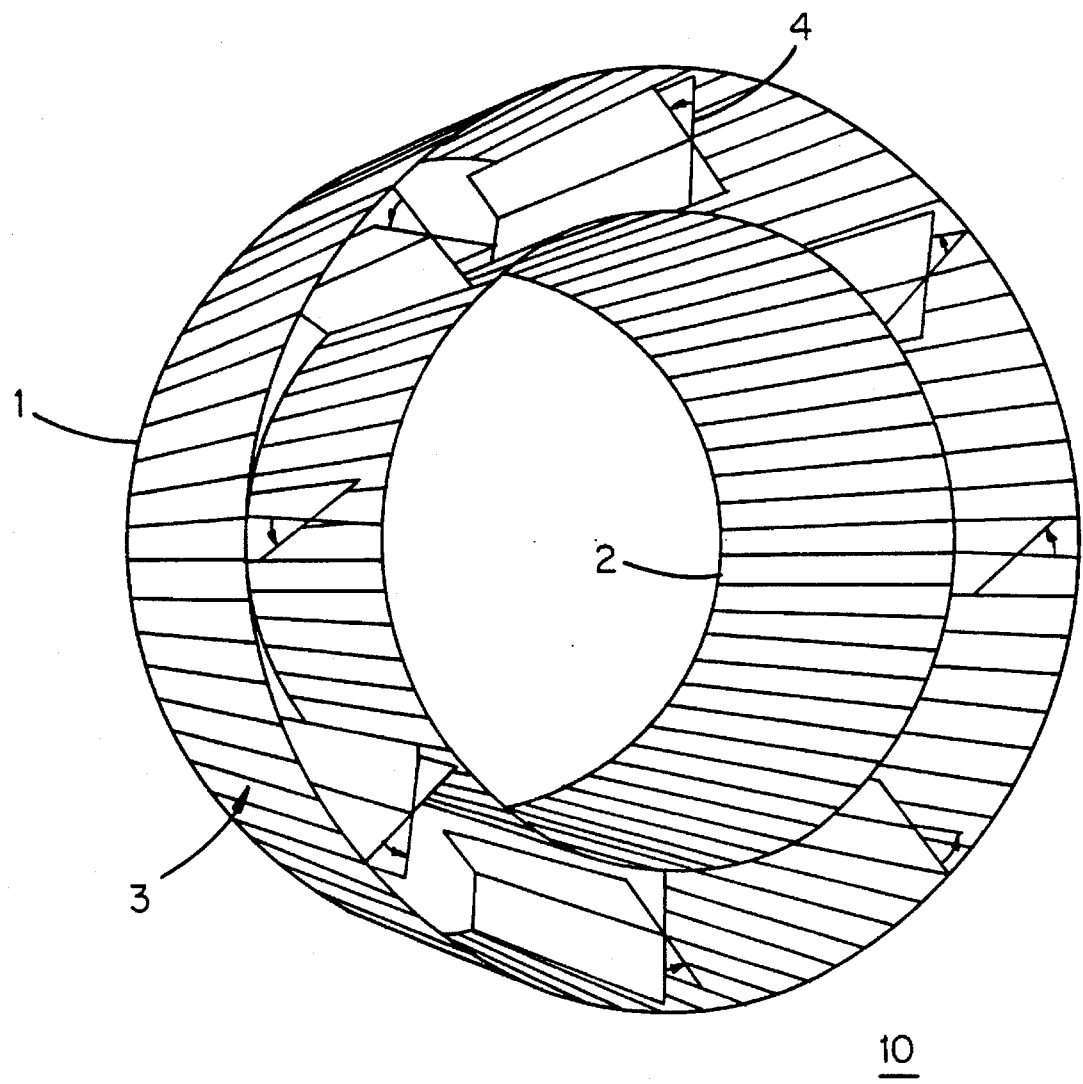
FIG. 1 is a perspective view of an MRI probe/transmitter coil with resonant elements.

FIG. 1 illustrates one arrangement of the present invention for an MRI probe/transmitter coil 10. The coil includes two concentric cylinders, 1 and 2. The inner cylinder 2 is preferably sized so that a human head can be placed therein for testing. An RF shield 3 is placed as an outer coating around coil 10 (either on the inside or outside of outer cylinder 2) to minimize radiation loss at very high frequencies and limit perturbations caused by external RF sources. However, the RF shield is not always necessary for the operation of the present invention.

The resonant elements 4 constitute the active inductive elements of coil 10 (along with RF shield 3 when required), and are used to tune the overall resonant frequency of the coil. The resonant elements are radially mounted between the two concentric cylinders 1 and 2, and as illustrated, the resonant elements 4 are shown in two different positions. This rotation of the resonant elements is used to tune the overall resonant frequency of the probe/transmitter coil 10. The resonant elements are freely rotatable and can be moved and/or tuned independent of each other.

As configured, this probe/transmitter coil is in the form of a relatively closed cage with individually tuned resonant elements 4, forming a low-loss resonator (having inductive and capacitive components) subject to a low level of perturbation due to test subject characteristics. The electromagnetic energy stored in the resonant elements outside of the loading region (within cylinder 2) of the probe coil reduces the perturbation of the test subject on the field pattern of the coil while maintaining a coil high efficiency.

Figure 2:
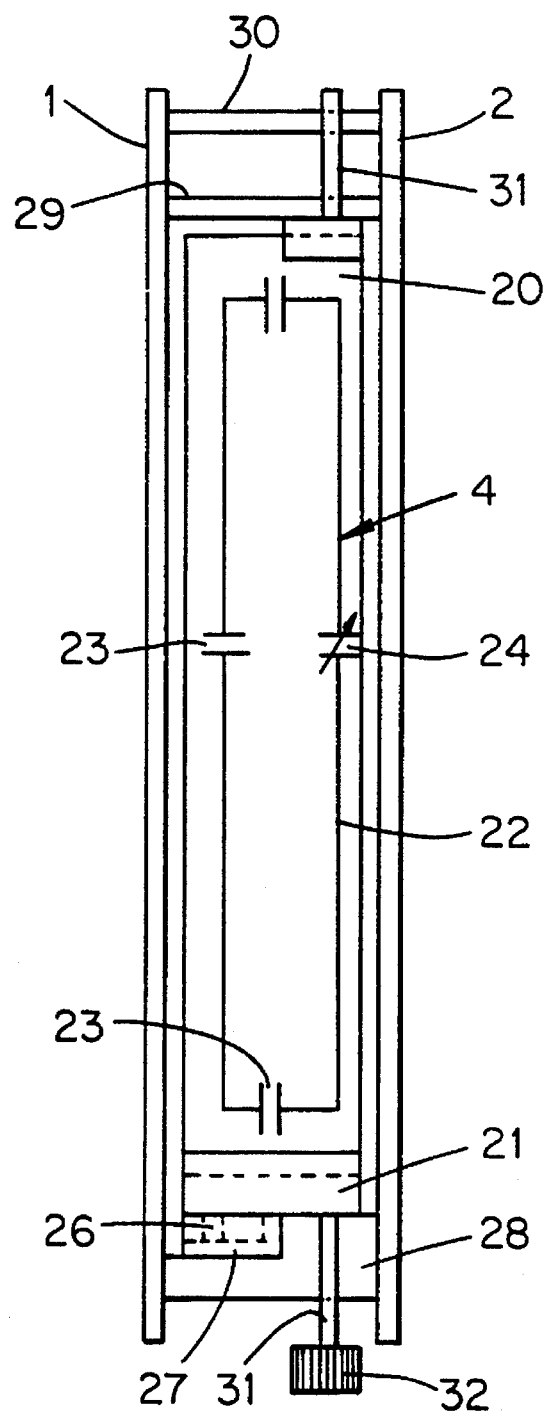
FIG. 2 is a side view of the resonant element mounted between the two concentric cylinders of the probe/transmitter coil.

One example of the free resonant-element coil of the present invention uses concentric cylinders made of 0.25" thick fiberglass. The outer diameter of the outer cylinder is 16". The inner diameter of the inner cylinder (the loading region of the probe) is 11". The length of the probe is 14.5". The inner surface of the outer cylinder is coated with a contiguous piece of thin copper (approximately 0.001" thick) to form a radio-frequency shield. End rings such as those designated by 27 and 30 in FIG. 2, are placed between the two cylinders 1 and 2, respectively, at both ends of the probe coil. It is noted that coil 10 can be made larger to accommodate larger body parts.

FIG. 2 illustrates a front view of the resonant element 4 as it is arranged between the outer cylinder 1 and the inner cylinder 2. As previously stated, the cylinders have end rings 28 and 30 at both ends of the probe coil located between the two cylinders. The resonant element 4 is constituted by a plurality of fixed capacitors 23 and at least one variable capacitor 24, all connected by copper tubes 22 acting as inductive elements. It is noted that while copper tubes are used in one embodiment of this invention, the constitution of the resonator 4 is not limited to this type of construction and other types of conductors can be used. In the same manner, other arrangements of capacitors besides that shown in FIG. 2 can also be utilized to constitute resonator 4.

The resonator is supported between the two cylinders 1 and 2 by axle 31 mounted in holes in outer rings 30 and 28, as well as inner ring 29. The resonating element, preferably mounted on a Lexan board 20 is attached to the axle 31 by means of a block 21. Each of the resonant elements 4 can be individually rotated about axle 31 using tuning knob 32. In the alternative, all of the resonant elements can be simultaneously rotated to the same extent of rotation using block 26 and sliding ring 27 in an arrangement further described and illustrated below.

To achieve the benefits of the present invention, the axles 31 are symmetrically spaced about the circumference of the two concentric cylinders 1 and 2 as shown in FIG. 3. The tuning knobs 32 are preferably located on the same side of the probe/transmitter coil but can be arranged so that they are located on both sides or eliminated altogether if asymmetric tuning of the coil is not considered desirable.

In the alternative, the resonant elements can be rotated asymmetrically to achieve asymmetric of the coil, that is, different resonant elements having different degrees of rotation about each respective axle 31. It is even conceivable that the symmetrical arrangement of FIG. 3 would not be used and that an asymmetrical arrangement of resonant elements could be found desirable in certain circumstances. Such circumstances would depend upon the configuration and other characteristics of the body part under test as well as the frequency range considered most desirable for carrying out that test.

One example of the structure shown in FIG. 2 includes a resonant element 4 having capacitors arranged in a symmetric fashion and connected by 0.25" diameter copper tubes. The Lexan board 20 of the resonant element 4 is arranged so that its plane is roughly in the radial direction between the two concentric cylinders 1 and 2.

The resonant modes of the probe/transmitter coil are determined from the following equation:

$$i\omega L I_k + \frac{I_k}{i\omega C} + \sum_{j \neq k} i\omega M_{|k-j|} I_j = 0, \tag{1}$$

where the L and C are the self-inductance and capacitance of each resonant element, $M_n$ designates the mutual inductance between two elements n units apart, $I_k$ is the current in the k'th element.

The resonant modes of interest are the two degenerate modes with a current distribution expressed as:

$$I_k = I_0 \cos\left(\frac{2\pi k}{N} + \phi\right), \quad (2)$$

where N is a total number of elements (16 as illustrated in FIG. 3) and phase shift $\phi$ is zero and $\pi/2$ for the two modes respectively. These two modes have a uniform magnetic field distribution in the loading region (within the inner cylinder 2). The resonance frequency of these two modes is determined from the first equation and is expressed as follows:

$$\omega = CL\left[1 + \sum_{j\neq 0} \frac{M_j}{L} \cos(2\pi j/N)\right]^{-1/2} \quad (3)$$

$$= \omega_o \left[1 + \sum_{j\neq 0} \frac{M_j}{L} \cos(2\pi j/N)\right]^{-1/2}$$

where $\omega_0$ is the resonance frequency of each individual element.

To determine the initial resonance frequency of each individual element such that the desired frequency $\omega_L$ falls into the tuning range of the probe, two resonant elements are tuned to an identical frequency $\omega_T$ proximate the desired frequency $\omega_L$. The two elements are placed in the probe at n units apart and due to the mutual inductance of the two elements, two resonant modes exist with the following frequencies:

$$\omega_{\pm} = \omega_t [1 \pm M_n/L]^{-1/2} \quad (4)$$

These two frequencies are measured for each distance n and the ratio $M_n/L$ is calculated from equation 4. By knowing the ratios $M_n/L$ and assuming that they do not change dramatically with frequency, these ratios can be used in the third equation to predict the resonance frequency $\omega_o$, with an accuracy of 2%.

Symmetric tuning by simultaneous rotation of all of the resonant elements 4 is accomplished as illustrated in FIGS. 4-7. Simultaneous rotation of all the resonant elements to the same extent is accomplished by moving slide ring 27, illustrated in FIG. 4. This ring is mounted adjacent to end ring 28 and next to block 21 (as illustrated in FIG. 2). Sliding ring 27 contains a series of slots 40 symmetrically disposed about the circumference of the ring. The slots are radially configured and face outward from the ring. A cross-section of this configuration is illustrated in FIG. 5. Sliding ring 27 is supported by end ring 28, and can slide within the "L" configuration of ring 28. As ring 27 moves, the slots 40 will also move.

Figure 6:
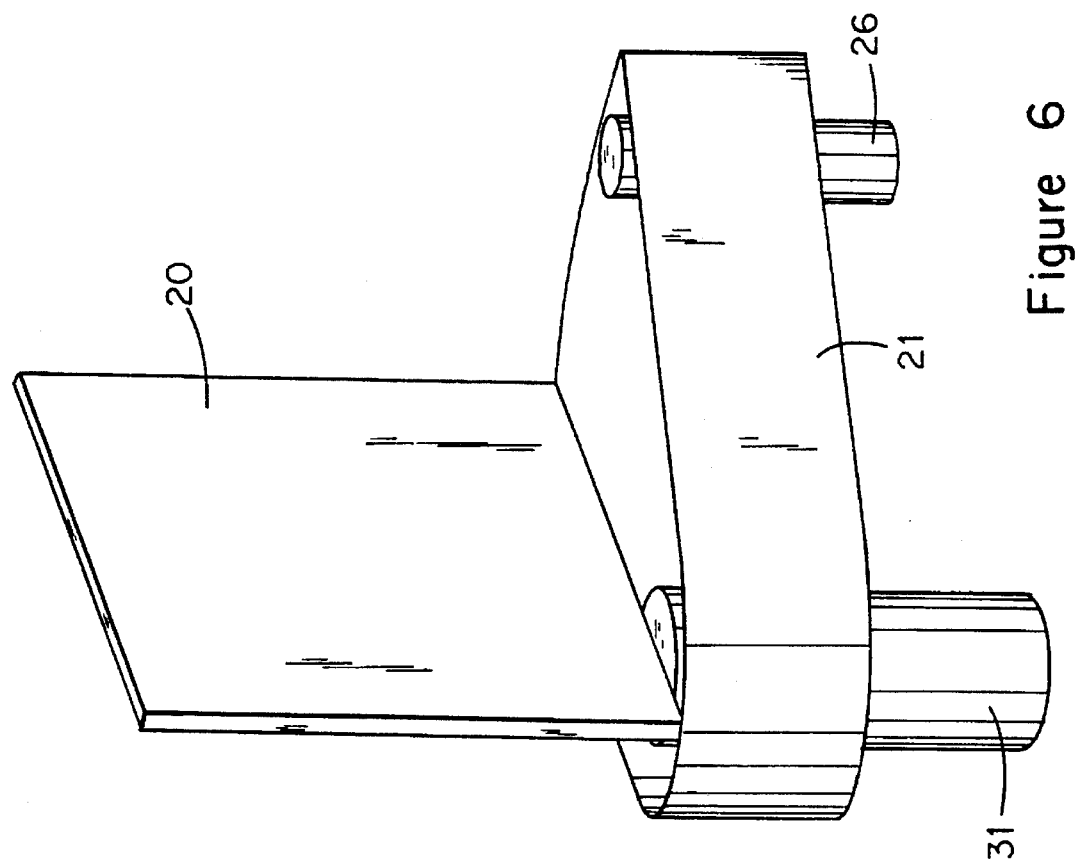
FIG. 6 is a perspective view of a mounting block used to support the resonant elements.

As illustrated in FIG. 6, each of the resonant elements 4 includes a Lexan board 20 which is mounted on a Lexan block 21. Axle 31 is inserted into this block and is in turn inserted into end ring 28 for support. A second axle or pin 26 is mounted in the block offset from the axes of Lexan board 20 and axle 31. It is noted that in the preferred embodiment, block 21 is made out of Lexan. However, other suitable materials can be used to constitute the block 21 as well as the circuit board 20 supporting the resonant element 4.

Figure 7:
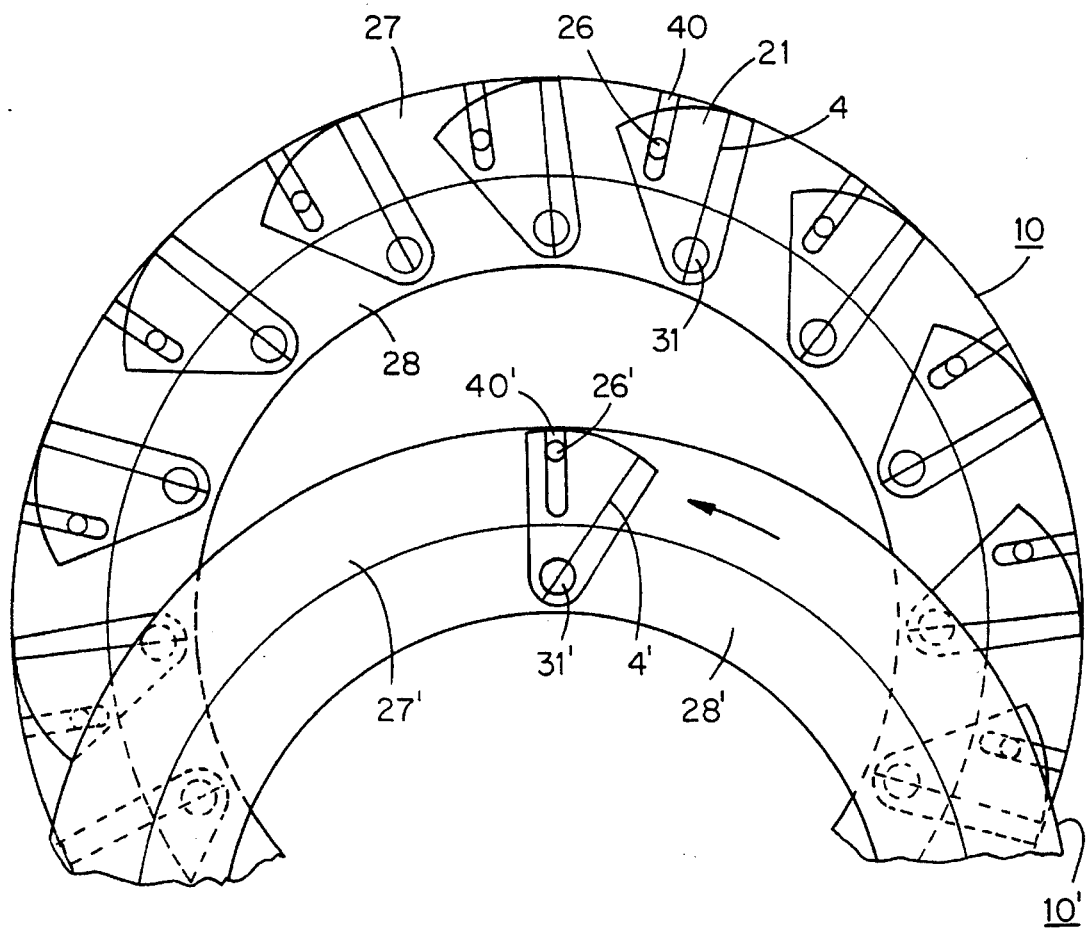
FIG. 7 is a top view of the probe/transmitter coil overlapped to show two positions of a mechanism used to adjust the position of the resonant elements.

The effect of moving sliding ring 27 with pins 26 inserted into slots 40 is illustrated in FIG. 7. One position is illustrated in the upper portion of this figure, including slide ring 27, slot 40, block 21, axle 30 with the plane of the resonant element 4 located thereon. The axle 31 for each of the resonant elements is supported through end ring 28. When sliding ring 27 is rotated or translated with respect to end ring 28, pin 26' (as illustrated in the second or lower portion of FIG. 7) is forced to move in slot 40' as shown, i.e., towards the outer axis of the coil. This will result in a rotation of axle 31' and a movement of resonant element 4' to a different angle with respect to the outer surface of the probe/transmitter coil 10. By turning sliding ring 27, each of the resonant elements 4 will be rotated to the same degree providing a predicable method for tuning the overall resonance frequency of the coil.

Figure 9:
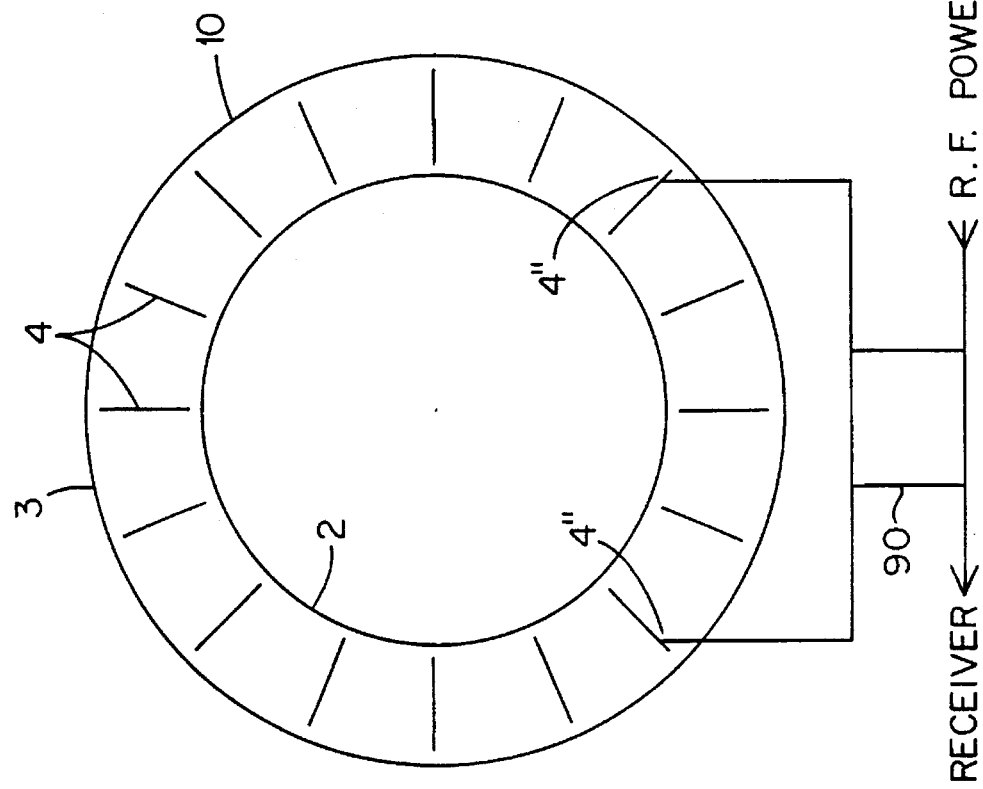
FIG. 9 illustrates the connection between a quadhybrid circuit and the probe/transmitter coil of the present invention.
Figure 8:
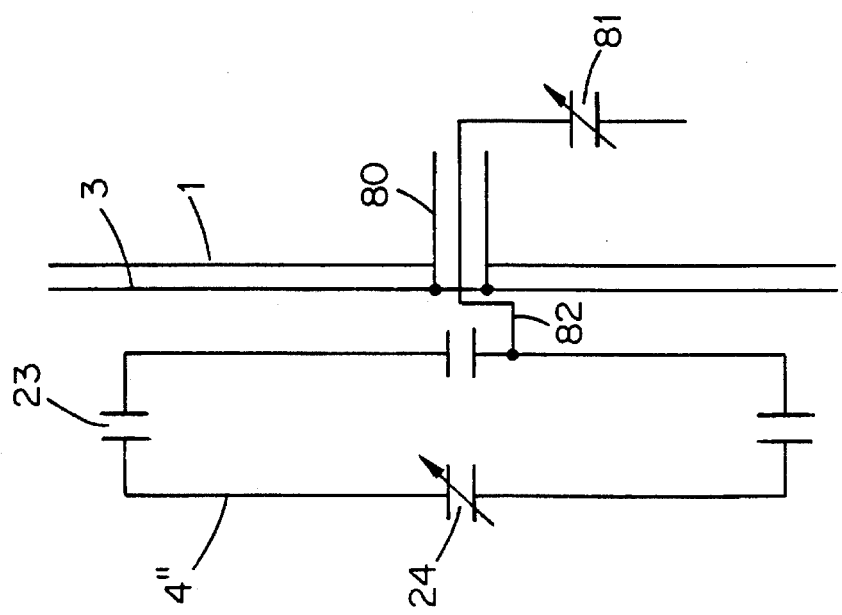
FIG. 8 illustrates the electrical connection between a resonant element and an exterior power source.

One method of driving the probe/transmitter coil of the present invention is illustrated in FIGS. 8 and 9. The coil is driven at two resonant elements 90° apart so that the two degenerate modes expressed in equation 2 are excited simultaneously. A quadrature hybrid circuit (90 as illustrated in FIG. 9) is used between the two driving ports (to selected resonant elements 4") and the receiver/RF amplifier. When the coil is used as a transmitter, the quadrature hybrid circuit 90 causes a 90° phase delay in the RF going into one driven resonant element 4" relative to the other driven resonant element. Thus, the two degenerate and orthogonal modes are excited with a 90° phase difference. The combined magnetic field of the two modes in the loading region (inside of the inner cylinder 2) is circularly polarized in the same sense and rotates at the same frequency as the nuclear magnetization of the subject. Thus, nuclear magnetization is continuously excited so as to optimize the energy efficiency.

In this example, the driven resonant element 4" is constituted by asymmetrical arrangement of fixed capacitors 23 and one variable capacitor 24. This element is connected through quadrature hybrid circuit 90 to an external receiver and RF power source. The connection is made by coaxial cable 80 which penetrates the radio frequency shield 3 located on the inner surface of cylinder 1. The outer portion of coaxial cable 80 is connected to the RF shield 3. The inner conductor 82 is connected to resonant element 4", and has sufficient length and flexibility to allow the resonant element 4" to rotate freely. Under some circumstances, a matching capacitor 81 may be necessary to match the impedance at the drive point to the preferred value of the transmit/receive circuit.

When this arrangement is used as a receiver, the signals received from the two driven ports (connected by coaxial cable 80) are again 90° apart in phase due to a circular polarization of the nuclear magnetization. The quadrature hybrid circuits corrects this phase difference before summing the two signals together, as is well known with quadrature techniques.

One example of the probe/transmitter coil operates at 170.74 MHz with a tuning range of plus minus 6 MHz. The quality value Q without loading is 680, and is 129 when loaded with a head of a nominal diameter of 7.3". The resonant frequency increases by 120 KHz with this loading.

Although a number of arrangements of the invention have been mentioned by way of example, it is not intended that the invention be limited thereto. Accordingly, the invention should be considered to include any and all configurations, modifications, variations, combinations or equivalent arrangements falling within the scope of the following claims.

We claim:

1. An MRI transceiver coil comprising:
   (a) a pair of concentric cylinders;
   (b) a plurality of resonant elements, radially mounted between said cylinders, said resonant elements each comprising a circuit board having an inductive element and a series of capacitances, each said circuit board having a longitudinal axis arranged in parallel to longitudinal axis of said concentric cylinders;

first means for holding said resonant elements and second means for holding said resonant elements, said first and second means for holding being arranged at opposite ends of said pair of concentric cylinders and between said concentric cylinder;

an axel for each said resonant element, each said axel being pivotly held in first and second means for holding; and means for freely pivotly mounting each said axel to said first and second means for holding for each of said resonance elements so that each said resonant element is separate from said other resonant elements, wherein said resonant elements are inductively coupled to other resonant elements.

2. The coil of claim 1, wherein said coil is quadrature driven.

3. The coil of claim 1, wherein said resonant elements are symmetrically mounted along the circumference of said concentric cylinders.

4. The coil of claim 1, wherein each said resonant element comprises at least one variable capacitor.

5. The coil of claim 4, further comprising a radio frequency shield on the outer cylinder of said pair of concentric cylinders.

6. The coil of claim 4, further comprising a tuning knob for each said resonant element wherein each said resonant element is separately rotated on its axle by said tuning knob.

7. The coil of claim 4, further comprising means for rotating all said resonant elements simultaneously, imparting the same degree of rotation to each of said resonant elements.

8. The coil of claim 7, wherein said means for simultaneously tuning comprise a slide ring fitted over one of said holding means and having a plurality of radial slots, and a mounting block fitted at one end of each said resonant element, adjacent said sliding ring, said mounting block having a pin arranged parallel to each said axle and located so as to fit into one of said radial slots in said slide ring, wherein movement of said slide ring causes movement of each said pin in each said radial slot creating a rotation about each said axle of each said resonant element thereby pivoting each said resonant element to change the tuning of said coil.

9. The coil of claim 2, further comprising an RF power source, a quad-hybrid circuit connected between said RF power source and a receiver, said quad-hybrid circuit further being connected to said resonant elements through a coaxial cable.

10. The coil of 9, further comprising a matching capacitor connected between said quad-hybrid circuit and each of said resonant elements connected to said quad-hybrid circuit.

* * * * *